US012609665B2

(12) United States Patent
Mutnury et al.

(10) Patent No.: US 12,609,665 B2
(45) Date of Patent: Apr. 21, 2026

(54) DE-SKEWING DIFFERENTIAL SIGNALS

(71) Applicant: Dell Products L.P., Round Rock, TX (US)

(72) Inventors: Bhyrav M. Mutnury, Austin, TX (US); Sandor Tibor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 450 days.

(21) Appl. No.: 18/314,216

(22) Filed: May 9, 2023

(65) Prior Publication Data

US 2024/0380371 A1      Nov. 14, 2024

(51) Int. Cl.
H03F 3/45        (2006.01)
H03F 1/02        (2006.01)
H05K 1/02        (2006.01)

(52) U.S. Cl.
CPC ....... H03F 3/45968 (2013.01); H03F 1/0222 (2013.01); H05K 1/0248 (2013.01)

(58) Field of Classification Search
CPC . H03F 3/45968; H03F 1/0222; H05K 1/0248; H05K 1/0245
USPC .......................................................... 330/9
See application file for complete search history.

(56) References Cited

U.S. PATENT DOCUMENTS 5,420,536 A  *   5/1995  Faulkner ................... H03C 5/00
                                                            330/285
2018/0198424 A1*  7/2018  Sharma ............... H03F 3/45188
2021/0033662 A1*  2/2021  Al-Shyoukh .......... G01R 31/52

* cited by examiner

*Primary Examiner* — Andrea Lindgren Baltzell
*Assistant Examiner* — Jose E Pinero
(74) *Attorney, Agent, or Firm* — McDermott Will & Schulte LLP

(57)      ABSTRACT

A printed circuit board, including a first pre-amplifier positioned along a first trace configured to receive a first signal of a differential pair of signals; a second pre-amplifier positioned along a second trace configured to receive a second signal of the differential pair of signals; a difference amplifier configured to determine a difference between i) a first amplitude of the first signal at a particular frequency and ii) a second amplitude of the second signal at the particular frequency; and an integrator module configured to generate, based on the difference, a first bias signal and a second bias signal, wherein the first pre-amplifier is further configured to receive the first bias signal to control a first propagation speed of the first signal along the first trace, the first propagation speed of the first signal corresponding to a first magnitude of the first bias signal.

11 Claims, 4 Drawing Sheets

DE-SKEWING DIFFERENTIAL SIGNALS

BACKGROUND

Field of the Disclosure

The disclosure relates generally to de-skewing differential signals.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in a printed circuit board, including a first pre-amplifier positioned along a first trace configured to receive a first signal of a differential pair of signals; a second pre-amplifier positioned along a second trace configured to receive a second signal of the differential pair of signals; a difference amplifier configured to determine a difference between i) a first amplitude of the first signal at a particular frequency and ii) a second amplitude of the second signal at the particular frequency; and an integrator module configured to generate, based on the difference, a first bias signal and a second bias signal, wherein the first pre-amplifier is further configured to receive the first bias signal to control a first propagation speed of the first signal along the first trace, the first propagation speed of the first signal corresponding to a first magnitude of the first bias signal, wherein the second pre-amplifier is further configured to receive the second bias signal to control a second propagation speed of the second signal along the second trace, the second propagation speed of the second signal corresponding to a second magnitude of the second bias signal.

Other embodiments of these aspects include corresponding systems and apparatus.

These and other embodiments may each optionally include one or more of the following features. For instance, the first pre-amplifier is configured to provide the first signal to an input buffer, and the second pre-amplifier is configured to provide the second signal to the input buffer. The first trace has a first length and the second trace has a second length, wherein the second length is greater than the first length. A second magnitude of the second bias signal is greater than a first magnitude of the first bias signal. The second propagation speed of the second signal is greater than the first propagation speed of the first signal. T first band-pass filter configured to select the particular frequency of the first signal; and a second band-pass filter configured to select the particular frequency of the second signal. A first peak detector configured to measure the first amplitude of the first signal at the particular frequency; and a second peak detector configured to measure the second amplitude of the second signal at the particular frequency. The particular frequency is the Nyquist frequency.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
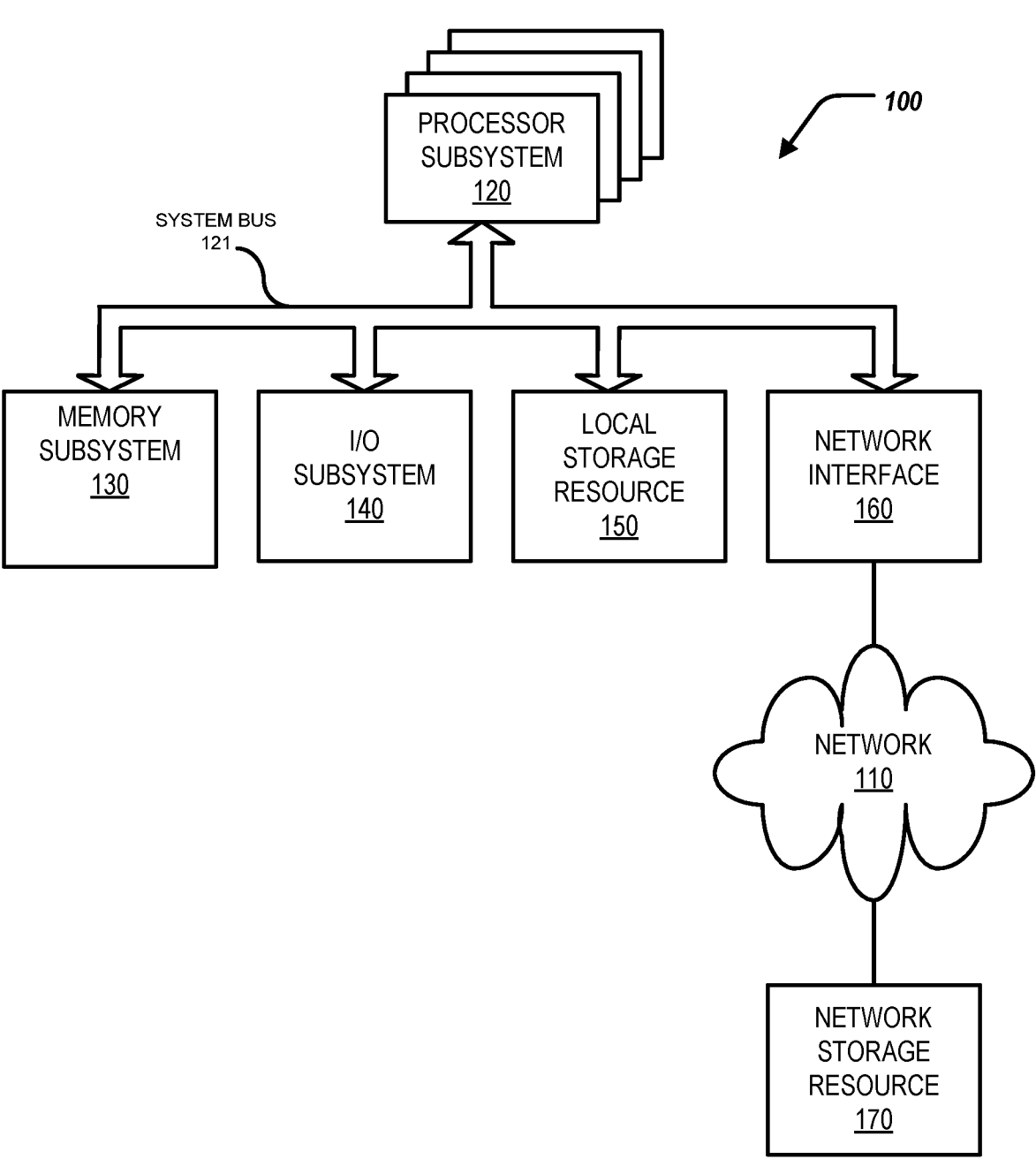
FIG. 1 is a block diagram of selected elements of an embodiment of an information handling system.

This disclosure discusses de-skewing of differential signals. In short, differential signals can accumulate skew as they travel through trace bends, fiber waves, and other board imperfections. This skew can reduce differential signal bandwidth and create a common mode signal component. The propagation speed of such signals can be adjusted to compensate for such skew.

Specifically, this disclosure discusses a printed circuit board, including: a first pre-amplifier positioned along a first trace configured to receive a first signal of a differential pair of signals; a second pre-amplifier positioned along a second trace configured to receive a second signal of the differential pair of signals; a difference amplifier configured to determine a difference between i) a first amplitude of the first signal at a particular frequency and ii) a second amplitude of the second signal at the particular frequency; and an integrator module configured to generate, based on the difference, a first bias signal and a second bias signal, wherein the first pre-amplifier is further configured to receive the first bias signal to control a first propagation speed of the first signal along the first trace, the first propagation speed of the first signal corresponding to a first magnitude of the first bias signal, wherein the second pre-amplifier is further configured to receive the second bias signal to control a second propagation speed of the second signal along the second trace, the second propagation speed of the second signal corresponding to a second magnitude of the second bias signal.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Figure 2:
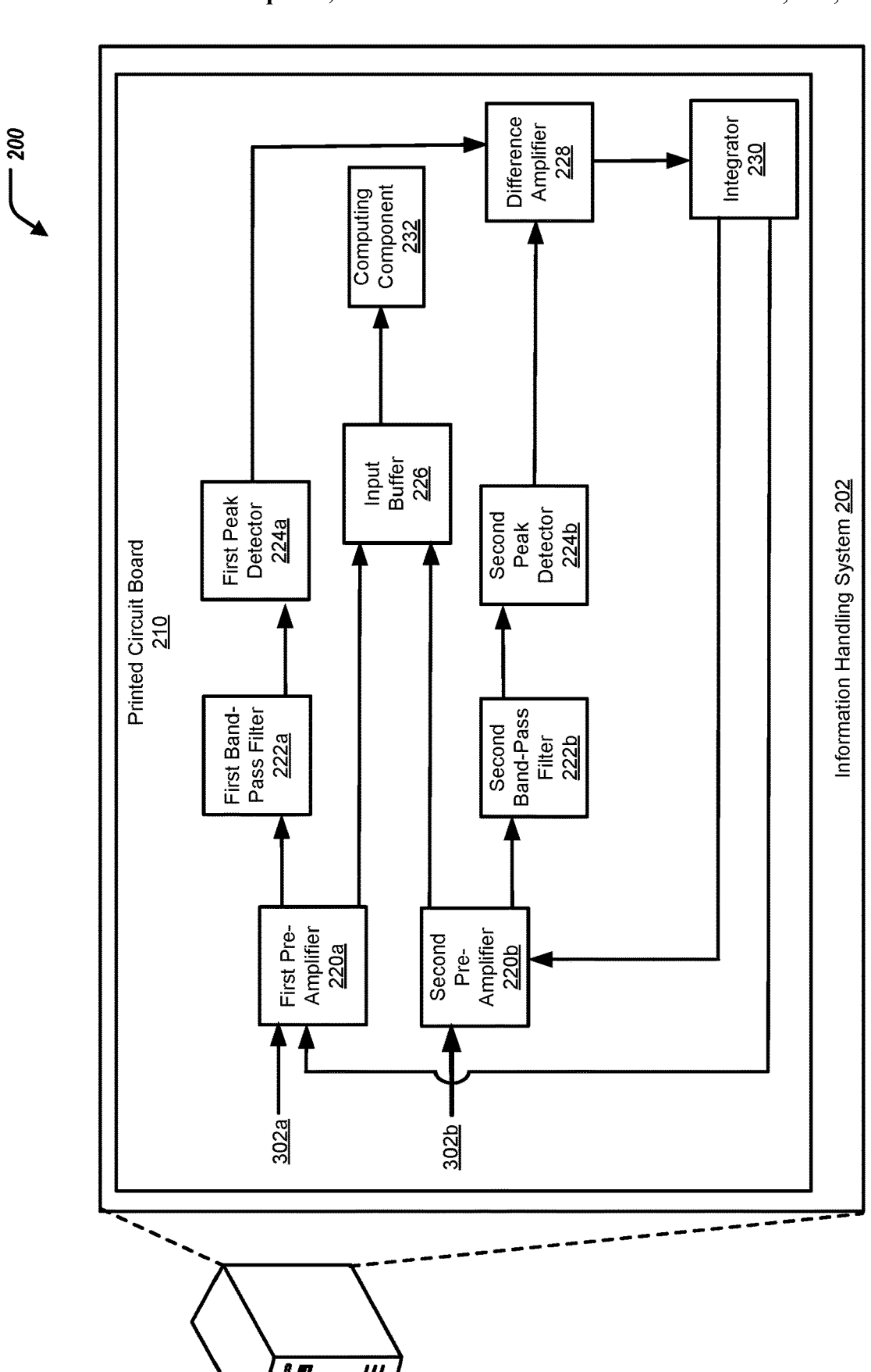
FIG. 2 illustrates a block diagram of an information handling system.
Figure 3:
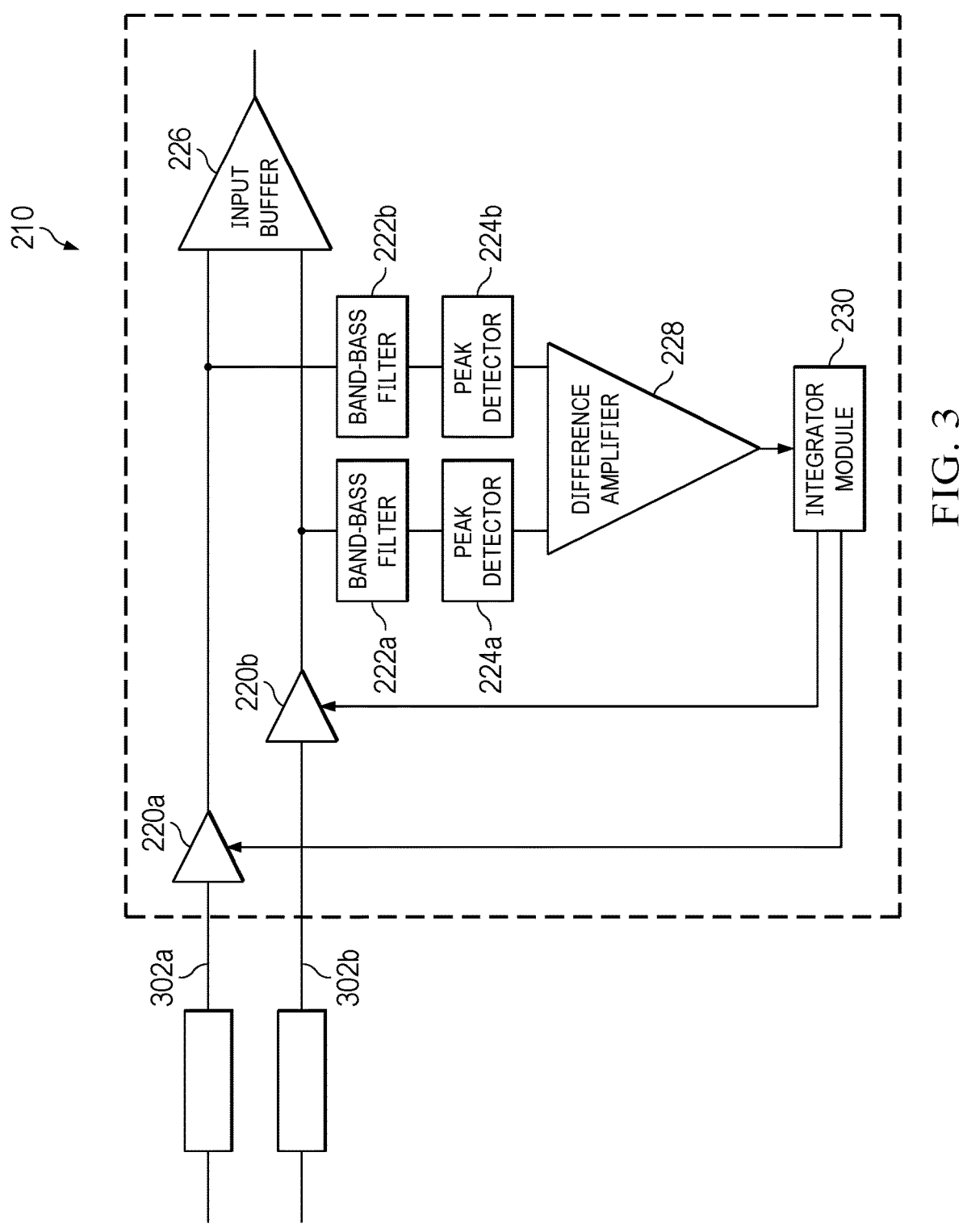
FIGS. 3 and 4 illustrate a portion of a printed circuit board of the information handling system.

Particular embodiments are best understood by reference to FIGS. 1-3 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Turning to FIG. 2, FIG. 2 illustrates an environment 200 including an information handling system 202. The information handling system 202 can include a printed circuit board (PCB) 210. In some examples, the information handling system 202 is similar to, or includes, the information handling system 100 of FIG. 1.

The PCB 210 can include a first pre-amplifier 220a, a second pre-amplifier 220b, a first band-pass filter 222a, a second band-pass filter 222b, a first peak detector 224a, a second peak detector 224b, an input buffer 226, a difference amplifier 228, an integrator 230, and a computing component 232.

The first pre-amplifier 220a can receive a signal along a first trace 302a. The first pre-amplifier 220a can be in communication with the first band pass-filter 222a and the input buffer 226. The first band-pass filter 222a can be in communication with the first peak detector 224a. The first peak detector 224a can be in communication with the difference amplifier 228.

The second pre-amplifier 220b can receive a signal along a second trace 302b. The first pre-amplifier 220a can be in communication with the second band pass-filter 222b and the input buffer 226. The second band-pass filter 222b can be in communication with the second peak detector 224b. The second peak detector 224b can be in communication with the difference amplifier 228.

The input buffer 226 can be in communication with the computing component 232. The difference amplifier 228 can be in communication with the integrator 230. The integrator 230 can be in communication with the first pre-amplifier 220a and the second pre-amplifier 220b.

In short, differential signals can accumulate skew as they travel through trace bends, fiber waves, and other board imperfections. This skew can reduce differential signal bandwidth and create a common mode signal component. The propagation speed of such signals can be adjusted to compensate for such skew.

Figure 4:
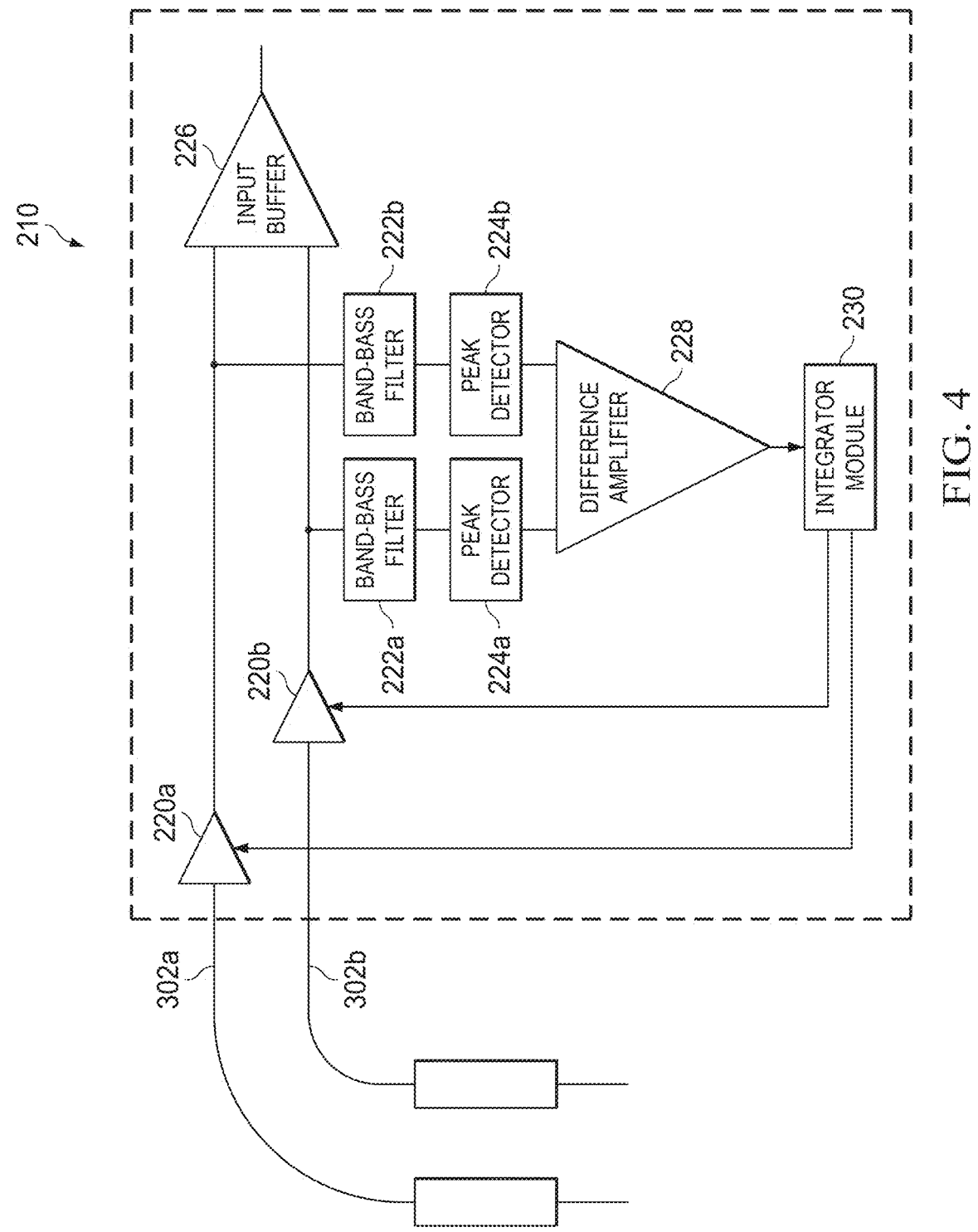

FIG. 3 illustrates a block diagram of the PCB 210. The PCB 210 can include a first trace 302a and a second trace 302b (collectively referred to as traces 302). The first trace 302a can be of a first length and the second trace 302b can be of a second length. In some examples, the second length of the second trace 302b is greater than the first length of the first trace 302a. For example, the traces 302 can physically "turn" on the PCB 210—that is, each of the traces 302 can include an arc of a differing radius, as shown in FIG. 4. Due to the differing radiuses of the arc of each of the traces 302, the traces 302 can be of differing physical lengths, as shown in FIG. 4.

The first pre-amplifier 220a can be positioned along the first trace 302a. The first pre-amplifier 220a is configured to receive a first signal of a differential pair of signals (e.g., transmitted along the first trace 302a). The first pre-amplifier 220a can amplify a magnitude of the first signal. The first pre-amplifier 220a can provide the first signal to the input buffer 226.

The second pre-amplifier 220b can be positioned along the second trace 302b. The second pre-amplifier 220b is configured to receive a second signal of the differential pair of signals (e.g., transmitted along the second trace 302b). The second pre-amplifier 220b can amplify a magnitude of the second signal. The second pre-amplifier 220b can provide the second signal to the input buffer 226.

The input buffer 226 can provide the first signal, the second signal, a combination of the first signal and the second signal, or any type of derivative/processing of the first signal and/or the second signal to the computing component 232. The computing component 232 can process such accordingly as appropriate.

In some examples, as the second length of the second trace 302b is greater than the first length of the first trace 302a, the input buffer 226 can receive the first signal from the first pre-amplifier 220a prior to receiving the second signal from the second pre-amplifier 220b. The band pass filters 222a, 222b; the peak detectors 224a, 224b; the difference amplifier 228; and the integrator 230 can reduce, minimize, compensate, and/or prevent such delay, described further herein.

The first band-pass filter 222a is configured to select a particular frequency of the first signal. That is, the first band-pass filter 222a filters the first signal to include only the particular frequency. In some examples, the particular frequency is the Nyquist frequency. Similarly, the second band-pass filter 222b is configured to select the particular frequency of the second signal. That is, the second band-pass filter 222b filters the second signal to include only the particular frequency.

The first peak detector 224a is configured to measure a first amplitude of the first signal at the particular frequency.

Similarly, the second peak detector 224*b* is configured to measure a second amplitude of the second signal at the particular frequency.

The difference amplifier 228 is configured to determine a difference between the first amplitude of the first signal at the particular frequency and the second amplitude of the second signal at the particular frequency. In short, the difference in the amplitude of the first signal at the particular frequency and the second amplitude of the second signal at the particular frequency can indicate signal skew of the differential pair of signals. That is, the delta between the first amplitude of the first signal and the second amplitude of the second signal is proportional to the signal skew of the differential pair of signals.

The integrator module 230 is configured to generate, based on the difference, a first bias signal and a second bias signal. Specifically, the integrator module 230 generates, based on the difference between the first amplitude of the first signal at the particular frequency and the second amplitude of the second signal at the particular frequency, a first bias signal and a second bias signal. Specifically, the integrator module 230 generates the first bias signal and the second bias signal since based on the difference of the first amplitude and the second amplitude to adjust a speed/timing of each of the first and the second signals, described further herein. In some examples, a magnitude of the second bias signal is greater than a magnitude of the first bias signal. The magnitude of each of the first bias signal and the second bias signal is an amperage magnitude of each of the first bias signal and the second bias signal, respectfully.

The first pre-amplifier 220*a* is configured to receive the first bias signal from the integrator module 230. The first bias signal controls a first propagation speed of the first signal along the first trace 302*a*. That is, the first pre-amplifier 220*a* adjusts the first propagation speed of the first signal along the first trace 302*a* based on the magnitude (amperage) of the first bias signal. The first propagation speed of the first signal corresponds to the first magnitude of the first bias signal. Specifically, the first propagation speed of the first signal is a function of the first bias current. In some examples, the first pre-amplifier 220*a* decreases the first propagation speed of the first signal based on a decrease in the magnitude of the first bias current.

Similarly, the second pre-amplifier 220*b* is configured to receive the second bias signal from the integrator module 230. The second bias signal controls a second propagation speed of the second signal along the second trace 302*b*. That is, the second pre-amplifier 220*b* adjusts the second propagation speed of the second signal along the second trace 302*b* based on the magnitude (amperage) of the second bias signal. The second propagation speed of the second signal corresponds to the second magnitude of the second bias signal. Specifically, the second propagation speed of the second signal is a function of the second bias current. In some examples, the second pre-amplifier 220*b* increases the second propagation speed of the second signal based on an increase in the magnitude of the second bias current.

To that end, the second propagation speed of the second signal is greater than the first propagation speed of the first signal. That is, as the first pre-amplifier 220*a* decreases the first propagation speed of the first signal based on a decrease in the magnitude of the first bias current and the second pre-amplifier 220*b* increases the second propagation speed of the second signal based on an increase in the magnitude of the second bias current, the second propagation speed of the second signal becomes greater than the first propagation speed of the first signal.

As a result, the difference in speed of the first and the second signals compensates for the difference in lengths of the traces 302. Specifically, the second propagation speed of the second signal being greater than the first propagation speed of the first signal compensates for the second length of the second trace 302*b* being greater than the first length of the first trace 302*a*. As a result, the input buffer 226 can receive the second signal from the second pre-amplifier 220*b* at substantially the same time as receiving the first signal from the first pre-amplifier 220*a*.

The propagation speeds of the traces 302 can be continuously adjusted as described herein. That is, the pre-amplifiers 220, the band-pass filters 222, the peak detectors 224, the difference amplifier 228, and the integrator module 230 form a closed loop that will adjust the propagation speeds of the traces 302 until an equilibrium is reached—i.e., the input buffer 226 receives the first and the second signals at substantially the same time.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A printed circuit board, including:

a first pre-amplifier positioned along a first trace configured to receive a first signal of a differential pair of signals, the first trace including a first arc of a first radius;

a second pre-amplifier positioned along a second trace configured to receive a second signal of the differential pair of signals, the second trace including a second arc of a second radius, wherein the second radius is greater than the first radius;

a difference amplifier configured to determine a difference between i) a first amplitude of the first signal at a particular frequency and ii) a second amplitude of the second signal at the particular frequency; and an integrator module configured to generate, based on the difference, a first bias signal and a second bias signal, wherein the first pre-amplifier is further configured to receive the first bias signal to control a first propagation speed of the first signal along the first trace, the first propagation speed of the first signal corresponding to a first magnitude of the first bias signal, wherein the second pre-amplifier is further configured to receive the second bias signal to control a second propagation speed of the second signal along the second trace, the second propagation speed of the second signal corresponding to a second magnitude of the second bias signal, wherein a second magnitude of the second bias signal is greater than a first magnitude of the first bias signal such that the second propagation speed of the second signal is greater than the first propagation speed of the first signal, wherein the second propagation speed of the second bias signal being greater than the first propagation speed of the first signal compensates for the second radius being greater than the first radius such that an input buffer receives the second signal at substantially the same time as the first signal.

2. The printed circuit board of claim 1, wherein the first pre-amplifier is configured to provide the first signal to the input buffer, and the second pre-amplifier is configured to provide the second signal to the input buffer.

3. The printed circuit board of claim 1, further including:

a first band-pass filter configured to select the particular frequency of the first signal; and a second band-pass filter configured to select the particular frequency of the second signal.

4. The printed circuit board of claim 3, further including:

a first peak detector configured to measure the first amplitude of the first signal at the particular frequency; and a second peak detector configured to measure the second amplitude of the second signal at the particular frequency.

5. The printed circuit board of claim 1, wherein the particular frequency is the Nyquist frequency.

6. A printed circuit board, including:

a first trace including a first arc having a first radius;

a second trace including a second arc having a second radius, the second radius greater than the first radius;

a first pre-amplifier positioned along the first trace configured to receive a first signal of a differential pair of signals and to provide the first signal to an input buffer;

a second pre-amplifier positioned along the second trace configured to receive a second signal of the differential pair of signals and to provide the second signal to the input buffer;

a difference amplifier configured to determine a difference between i) a first amplitude of the first signal at a particular frequency and ii) a second amplitude of the second signal at the particular frequency; and an integrator module configured to generate, based on the difference, a first bias signal and a second bias signal, wherein a second magnitude of the second bias signal is greater than a first magnitude of the first bias signal, wherein the first pre-amplifier is further configured to receive the first bias signal to control a first propagation speed of the first signal along the first trace, the first propagation speed of the first signal corresponding to the first magnitude of the first bias signal, wherein the second pre-amplifier is further configured to receive the second bias signal to control a second propagation speed of the second signal along the second trace, the second propagation speed of the second signal corresponding to the second magnitude of the second bias signal, wherein the second magnitude of the second bias signal is greater than the first magnitude of the first bias signal such that the second propagation speed of the second signal is greater than the first propagation speed of the first signal, wherein the second propagation speed of the second bias signal being greater than the first propagation speed of the first signal compensates for the second radius being greater than the first radius such that the input buffer receives the second signal at substantially the same time as the first signal.

7. The printed circuit board of claim 6, further including:

a first band-pass filter configured to select the particular frequency of the first signal; and a second band-pass filter configured to select the particular frequency of the second signal.

8. The printed circuit board of claim 7, further including:

a first peak detector configured to measure the first amplitude of the first signal at the particular frequency; and a second peak detector configured to measure the second amplitude of the second signal at the particular frequency.

9. The printed circuit board of claim 6, wherein the particular frequency is the Nyquist frequency.

10. A printed circuit board, including:

a first trace including a first arc having a first radius;

a second trace including a second arc having a second radius, the second radius greater than the first radius length;

a first pre-amplifier positioned along the first trace configured to receive a first signal of a differential pair of signals and to provide the first signal to an input buffer;

a second pre-amplifier positioned along the second trace configured to receive a second signal of the differential pair of signals and to provide the second signal to the input buffer;

a first band-pass filter configured to select a particular frequency of the first signal;

a second band-pass filter configured to select the particular frequency of the second signal;

a first peak detector configured to measure a first amplitude of the first signal at the particular frequency;

a second peak detector configured to measure a second amplitude of the second signal at the particular frequency;

a difference amplifier configured to determine a difference between the first amplitude and the second amplitude;

an integrator module configured to generate, based on the difference, a first bias signal and a second bias signal, wherein a second magnitude of the second bias signal is greater than a first magnitude of the first bias signal;

wherein the first pre-amplifier is further configured to receive the first bias signal to control a first propagation speed of the first signal along the first trace, the first propagation speed of the first signal corresponding to the first magnitude of the first bias signal, wherein the second pre-amplifier is further configured to receive the second bias signal to control a second propagation speed of the second signal along the second trace, the second propagation speed of the second signal corresponding to the second magnitude of the second bias signal, wherein the second magnitude of the second bias signal is greater than the first magnitude of the first bias signal such that the second propagation speed of the second signal is greater than the first propagation speed of the first signal, wherein the second propagation speed of the second bias signal being greater than the first propagation speed of the first signal compensates for the second radius being greater than the first radius such that the input buffer receives the second signal at substantially the same time as the first signal.

11. The printed circuit board of claim 10, wherein the particular frequency is the Nyquist frequency.

\* \* \* \* \*